United States Patent
Wäny

(10) Patent No.: US 7,521,663 B2
(45) Date of Patent: Apr. 21, 2009

(54) OPTOELECTRONIC DETECTOR WITH MULTIPLE READOUT NODES AND ITS USE THEREOF

(75) Inventor: Martin Wäny, Funchal (PT)

(73) Assignee: MESA Imaging AG, Zurich (CH)

( * ) Notice: Subject to any disclaimer, the term of this patent is extended or adjusted under 35 U.S.C. 154(b) by 101 days.

(21) Appl. No.: 10/572,108

(22) PCT Filed: Sep. 18, 2003

(86) PCT No.: PCT/CH03/00629

§ 371 (c)(1),
(2), (4) Date: Feb. 28, 2007

(87) PCT Pub. No.: WO2005/027230

PCT Pub. Date: Mar. 24, 2005

(65) Prior Publication Data

US 2007/0176079 A1    Aug. 2, 2007

(51) Int. Cl.
*H01L 31/00* (2006.01)

(52) U.S. Cl. ................. 250/214.1; 250/208.1

(58) Field of Classification Search ........... 250/214.1, 250/208.1, 214 R; 257/229–230, 448; 327/514
See application file for complete search history.

(56) References Cited

U.S. PATENT DOCUMENTS

| | | | |
|---|---|---|---|
| 5,416,318 A * | 5/1995 | Hegyi | 250/226 |
| 5,856,667 A | 1/1999 | Spirig et al. | |
| 5,900,654 A | 5/1999 | Spratt | |
| 6,825,455 B1 | 11/2004 | Schwarte | |
| 2004/0080938 A1 | 4/2004 | Holman et al. | |
| 2008/0203277 A1* | 8/2008 | Warszauer et al. | 250/208.1 |

FOREIGN PATENT DOCUMENTS

| | | |
|---|---|---|
| DE | 197 04 496 A1 | 3/1998 |
| EP | 0 764 987 A2 | 3/1997 |
| EP | 1521981 B1 | 2/2008 |
| GB | 2 164 493 A1 | 3/1986 |
| WO | WO 98/10255 A1 | 3/1998 |

OTHER PUBLICATIONS

Lange, R., et al., "Time-of-flight range imaging with a custom solid-state image sensor," Laser Metrology and Inspection, Proc. SPIE, vol. 3823, Munich, 1999, pp. 1-12.

Spirig, T., et al., "The Lock-In CCD—Two-Dimensional Synchronous Detection of Light," IEEE Journal of Quantum Electronics, vol. 31, No. 9, Sep. 1995, pp. 1705-1708.

* cited by examiner

*Primary Examiner*—Kevin Pyo
(74) *Attorney, Agent, or Firm*—Houston Eliseeva, LLP

(57) ABSTRACT

The present invention discloses an optoelectronic detector for light sensing. The optoelectronic detector has a photosensitive element that converts light into electrons. Efficient collection of these electrons at readout nodes, embedded in the photosensitive element, is required to make correct measurements of light characteristics such as, phase shift and intensity. This collection of electrons is achieved by applying a voltage gradient across an electrode within the optoelectronic detector. The optoelectronic detector can have multiple readout nodes. Further, the present invention discloses methods for detecting intensity and phase shift of impinging light and for suppression of background illumination while detecting the characteristics of light.

6 Claims, 7 Drawing Sheets

OPTOELECTRONIC DETECTOR WITH MULTIPLE READOUT NODES AND ITS USE THEREOF

BACKGROUND

The present invention broadly relates to electronic light sensing devices. More specifically, the present invention relates to an optoelectronic detector for detecting radiation synchronized with pulsed illumination and its use thereof for suppressing background illumination and phase shift calculation.

Electronic light sensing involves conversion of light into an electronically readable form. Optoelectronic detector has a light sensitive component. Light sensing component creates electron-hole pairs when light impinges on its surface. These electrons are subsequently integrated and readout to understand the characteristics of the light.

The light sensing devices can detect spatial distribution of impinging radiation from an object as well as gather information related to the distance of an object. Parameters such as intensity and phase of the modulated light reflected from an object measure the distance of a light-reflecting object. Light sensing devices that can measure such parameters are known as Photo mixing devices or gated views.

Light sensitive component of these Photo mixing devices are integrated in Charge Coupled Devices (CCD) technologies or in standard Complementary Metal Oxide Semiconductor (CMOS) processes. Both these technologies use the concept of photoelectric effect wherein light or photons interact with photosensitive materials, such as crystallized silicon, to create electron-hole pairs in the material.

CCD is a light-sensitive integrated circuit comprising a single detector cell or a one-dimensional or two-dimensional array of photocells each of which is a capacitor. It stores and displays data relating to an image by converting each picture element (also referred to as pixel) in the image into an electrical charge. Further, CCD based devices can add charges collected over several integration cycles. This leads to a better signal over noise ratio.

High fabrication cost and limited system integration on chip limits the use of CCD based devices in favor of CMOS based light sensing devices.

An optoelectronic detector based on CMOS technology comprises a single detector or one-dimensional or two-dimensional arrays of CMOS-based photodiodes/photogates and readout amplifiers.

Most known standard CMOS process based optoelectronic detectors, convert collected charges to voltage and buffer the voltage for readout. These optoelectronic detectors can implement a synchronous electronic shutter pixel that allows integration of charges corresponding to impinging light during very short integration times. This electronic shutter typically is a sample and hold switch. This switch requires sampling of free charges in the form of voltage, after every integration time. It is possible to add these voltages over multiple integration times to measure the free charges collected over multiple integration times. However, charge to voltage conversion introduces noise during each integration time. This noise gets added to the measured voltage in each integration time. Consequently, large amount of noise gets added leading to low precision in measuring the properties of impinged light.

Photogate based detector architecture overcomes this drawback of CMOS technology based optoelectronic detectors. In Photogate based optoelectronic detectors, photo generated charges are collected in a depletion region underneath the photogate. This depletion region is built by means of applying a suitable potential gradient to the photogate. This method of charge collection is similar to that in a CCD type detector.

After integration over a pre-defined time, using photogate architecture, collected charges are transferred to a readout node by means of changing the potential of the photogate. Photogate type devices feature the disadvantage of low charge transport efficiency compared to CCD type detectors.

Charge transport efficiency is the ratio of the number of electrons read by a sensing arrangement, coupled to the optoelectronic detector, to the number of electrons created in the photosensitive area of the optoelectronic detector. The number of electrons sensed by the sensing arrangement is lower than the number actually produced in the detector because a significant number of electrons are lost in their transport from the detector to the sensing instrument. This leads to poor measurements of light features such as phase separation and intensity. Therefore, quality of images produced using the optoelectronic detectors is not very good and often has low contrast and poor brightness.

The overall performance of both CCD and CMOS based optoelectronic detectors suffer from background illumination measured along with the actual signal, at the charge sensing devices. The background illumination can saturate the readout channel if its intensity is very high, or can deteriorate the contrast between the charge sensing devices. As a result, the precision for the detection of the phase and the spatial distribution of the impinging radiation is low.

In the existing CCD and CMOS based optoelectronic detectors, background illumination is suppressed by compressing the energy emitted by a light source in a short pulse and integrating the light only for short pulse's duration. Compression of energy involves reducing the on time of the light source as compared to the off time of the light source. This is effective for light sources with a low mean power relative to the background illumination but which can deliver pulse intensities above background illumination for short pulse times such as LED or LASER light sources.

The above method of background suppression requires modification (in this case compression) of the emitted light before the light impinges on the optoelectronic detector. There is no component in the optoelectronic detector that can contribute to reduction of background illumination. Thus, the amount of background illumination that is suppressed is limited, leading to imprecision in the detection of the properties of impinged light. Imprecision occurs as the effect of background illumination is also recorded with the properties of light.

Several patents disclose the use of abovementioned technologies for light sensing, some of which are explained hereinafter.

U.S. Pat. No. 5,856,667 titled "Apparatus and method for detection and demodulation of an intensity modulated radiation field", assigned to Leica A G, Heerbrugg, Switzerland discloses a CCD based image sensor with multiple image sensing elements. For sensing the light coming from an image, the system switches between the various image-sensing elements. Switching enables recording different parameters of the light at the different image sensing elements.

PCT patent application no. 98/10255 titled "Method and device for determining the phase and/or amplitude data of an electromagnetic wave", discloses a CCD based device for the calculation of phase and amplitude of an electromagnetic wave. The device collects electrons with the help of staircase shaped depletion region.

Although the abovementioned patents disclose light sensing devices, they suffer from one or more of the disadvantages cited earlier, i.e., low transport efficiency, background illumination and inaccurate measurement of light parameters.

Keeping the above discussion in consideration, there is a need for an invention that features the possibility of adding charges created during several integration times. Further, there is a need for an invention that can correctly detect the phase of impinging modulated radiation with respect to a reference phase by reducing background illumination of the impinging light. Also, there is a need for an invention that has a high transport efficiency and therefore, provides an increase in precision to detect the phase shift of the pulsed impinging radiation over other devices produced using standard CMOS technology.

SUMMARY

An objective of the present invention is to provide an optoelectronic detector with multiple readout nodes that can efficiently readout electrons generated by light in a photosensitive material.

Another objective of the present invention is to accurately measure characteristics of light such as phase and intensity.

Yet another objective of the present invention is to suppress the background illumination associated with modulated light.

The invention discloses architecture of an optoelectronic device comprising a photosensitive substrate with several readout nodes embedded in it. The photosensitive substrate and the readout nodes are oppositely doped, i.e., if the photosensitive substrate is n-type then the readout nodes are p-type and vice-versa. The substrate is covered with a dielectric layer, which in turn is covered with a layer of electrode. Several electrical contact sites are metallized to the electrode. Voltage is applied across the electrode through the electrical contact sites. Each readout node is connected to a charge-sensing device to read the charges integrated at the readout nodes.

The voltage gradient across the two electrical contact sites creates a potential gradient between suitably doped readout nodes. The voltage gradient applied is continuous and therefore, the potential gradient created by it, in the photosensitive substrate, is continuous. Light is impinged on the photosensitive substrate and consequently, free electrons are generated in the region between the readout nodes. The potential gradient forces these free electrons to collect at the readout node with higher potential. Continuity in the potential gradient between the readout nodes improves the efficiency in collection of electrons or the charge transport efficiency. The collected electrons are sensed using voltage or current measuring devices. For suppression of background illumination one of the readout nodes in the architecture is continuously drained out. The measured voltage and current values are used to calculate parameters such as intensity and phase shift.

BRIEF DESCRIPTION OF THE DRAWINGS

The preferred embodiments of the invention will hereinafter be described in conjunction with the appended drawings provided to illustrate and not to limit the invention, wherein like designations denote like elements, and in which.

DESCRIPTION OF PREFERRED EMBODIMENTS

The present invention illustrates an optoelectronic detector, with high charge transport efficiency, for sensing light. These optoelectronic detectors are used as single detectors or as an individual unit of an array of such detectors for sensing light. Further, the present invention presents an optoelectronic detector to detect phase shift of modulated light and to suppress background illumination from the emitted light. The detector has a photosensitive material in which electron and hole pairs are created when light impinges on the substrate. The number of electrons generated depends on the characteristics of light. These characteristics can be amplitude, frequency and phase shift of the light. To read the information conveyed by these electrons, they are collected at specific locations in the detector. Electrons are collected at these specific locations by applying a voltage gradient across an electrode. The collected electrons can be read through voltage or current sensing detectors.

Figure 1:
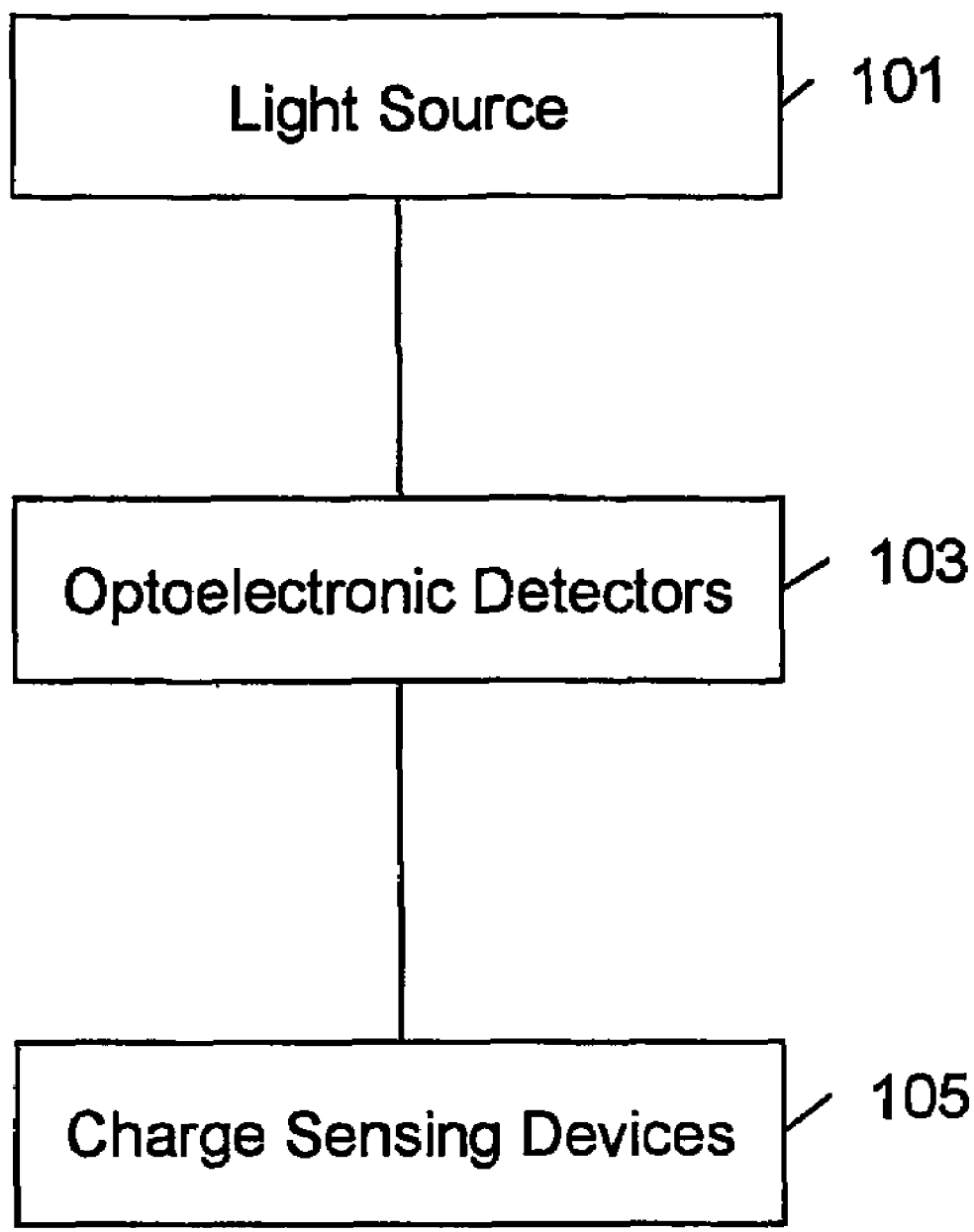
FIG. 1 illustrates a block diagram of the environment in which the present invention operates.

FIG. 1 illustrates a block diagram of the environment in which the present invention operates. Light source 101 is a source of light such as lasers, LED and the like. Optoelectronic detector 103, in accordance with the present invention, is exposed to light source 101. These light rays that fall on optoelectronic detector 103 convert light into free electrons. These free electrons are sensed by charge sensing devices 105 that are linked to optoelectronic detector 103.

Figure 2:
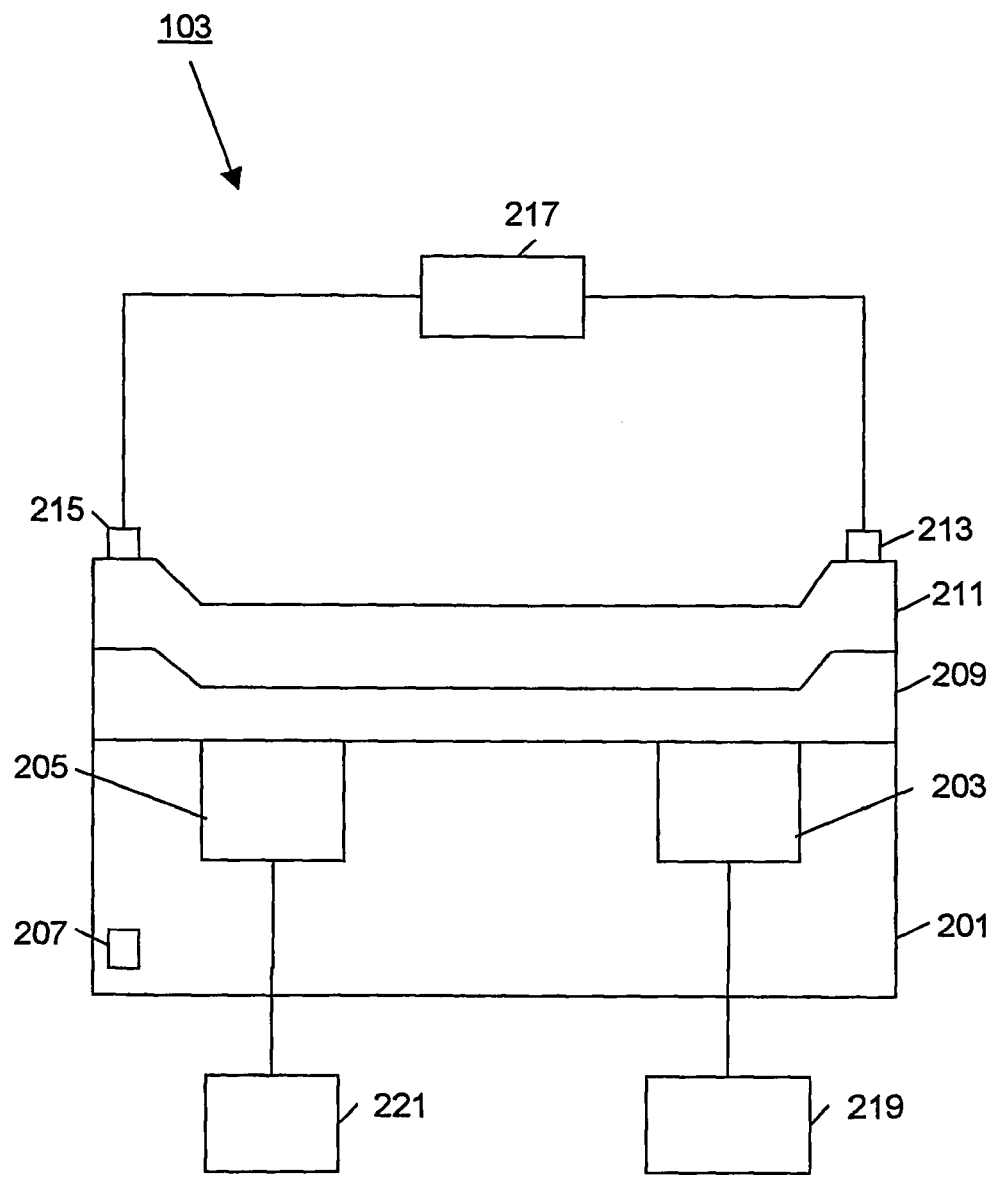
FIG. 2 illustrates a cross-sectional view of the architecture of an optoelectronic detector in accordance with preferred embodiment of the invention.

FIG. 2 illustrates a cross-sectional view of the architecture of an optoelectronic detector in accordance with a preferred embodiment of the invention. Optoelectronic detector 103 has a doped photosensitive substrate 201. Photosensitive substrate 201 is a doped semiconductor material such as Si, αSi, SiGe, GaAs and InPh. Photosensitive substrate 201 produces electron-hole pairs when light falls on it. Photosensitive substrate 201 is doped to become either n-type or p-type material. If substrate 201 is n-type, the major charge carriers are electrons. If substrate 201 is p-type, the major charge carriers are holes. Photosensitive substrate 201 has two oppositely doped regions, referred to as readout nodes 203 and 205, embedded on its surface. For example, in case photosensitive substrate 201 is p-type, readout nodes 203 and 205 are n-type and vice-versa. Although only two readout nodes have been shown in FIG. 2, it must be apparent to one skilled in the art that optoelectronic detector 103 can have any number of readout nodes. Photosensitive substrate 201 also has an electrical contact site 207 metallized on its surface to maintain photosensitive substrate 201 at a constant potential.

Dielectric layer 209 on top of photosensitive substrate 201 is a material with negligible electrical and thermal conductivity such as $SiO_2$, $SiN_x$, glass or porcelain. Dielectric 209 is transparent to the impinging light (e.g. IR, X-Ray, UV, Visible) from light source 101. Dielectric 209 layer prevents any electrical contact between photosensitive substrate 201 below it and electrode 211 layer above it.

Electrode 211 is transparent to impinging radiation (e.g. IR, X-Ray, UV, Visible) and is a conductive material. Voltage gradient between two points on the surface of electrode 211 causes flow of current across it. To apply the voltage gradient, two electrical contact sites 213 and 215 are metallized on the surface of electrode 211. Current generated by the applied voltage gradient must be low to reduce power consumption of the detector. Using a high resistivity material such as polysilicon, indium titane oxide and the like for electrode 211 ensures generation of a small current. A continuous voltage gradient is maintained across contact sites 213 and 215 by applying different voltages on contact sites 213 and 215. This voltage gradient creates a potential gradient between readout nodes 203 and 205. The details regarding the creation of potential gradient is provided later in the description. A switching unit 217 controls voltage gradient across contact sites 213 and 215.

Switching unit 217 varies the voltage gradient according to a switching sequence. Switching sequence defines variation in voltages at the electrical contact sites in a switching cycle and depends on the characteristics (e.g. modulation frequency) of incoming light. This switching sequence, implemented by switching unit 217, is synchronized to the modulation frequency of light emitted by light source 101. For example, if the light has a frequency of 10 Mhz (time period ~100 ns), in the first 50 ns cycle a positive voltage gradient is applied between electrical contact sites 213 and 215 and during the next 50 ns cycle a negative voltage gradient is applied between them.

When the light impinges on photosensitive substrate 201, after passing through transparent dielectric 209 and electrode 211 layers, it generates free electrons in the region between readout nodes 203 and 205. Light can also impinge directly on photosensitive substrate 201. This process of impingement directly on the surface of photosensitive substrate 201 is called back-illumination. Back illumination is useful in cases where electrode 209 and dielectric layer 211 are not transparent to impinging light.

Voltage gradient across contact sites 213 and 215 generates a potential gradient between readout nodes 203 and 205 forcing the free electrons towards one of the readout nodes. These free electrons contain information about the light such as amplitude, intensity and phase shift. Free electrons collected at readout nodes 203 and 205 are sensed using charge-sensing devices 219 and 221, respectively. Charge sensing device 219 corresponds to readout node 203 and charge-sensing device 221 corresponds to readout node 205. Charge sensing devices 219 and 221 can be voltage sensing or current sensing devices, i.e., the free electrons can be converted into an equivalent voltage or an equivalent current by the charge sensing devices. An example of a charge-sensing device is described later in conjunction with FIG. 3.

The collection of free electrons at a readout node requires generation of a depletion region between the readout nodes. Suppose, for p-type substrate 201, a continuous voltage gradient is applied across two contact sites 213 and 215 such that contact site 215 is at a higher voltage than contact site 213. This voltage gradient generates a region deficient in p-type carriers (holes) between readout nodes 203 and 205. This p-type deficient region is called the depletion region. Applied voltage is so selected that the depletion region extends over as large a surface as possible between readout nodes 203 and 205. However, the voltages are chosen such as to prevent a direct connection (by means of building a continuous channel) between the readout nodes 205 and 203. The applied voltage gradient also generates a continuous potential across the depletion region such that the higher potential is towards readout node 205.

For p-type substrate 201, the free electrons generated upon impingement of light collect at readout node 205 since readout node 205 is at a higher potential. Similarly, if the voltage gradient is reversed i.e. electrical contact site 213 has a higher voltage than contact site 215, the free electrons collect at readout node 203.

Time for which the free electrons are collected at a readout node is called integration time. For the example switching sequence, described already, integration time for both readout nodes 203 and 205 would be 50 ns. For optoelectronic detectors 103 with very short integration times, one of readout nodes 203 and 205 is drained constantly to prevent electron accumulation in optoelectronic detector 103. Connecting it to a reset potential, described later in description, drains the readout node.

In the present invention, the steering of free electrons to one of readout nodes 203 and 205 can be repeated over several cycles wherein each cycle consists of a switching sequence. In particular, for detectors with very small integration times, charge sensing devices 219 and 221 sense electrons collected at readout nodes 203 and 205 accumulated over multiple switching cycles. Several switching cycles are used to collect sufficient electrons, which are more than the free electrons created by background illumination, at the readout nodes. The number of cycles needed to collect sufficient electrons reduces with increase in transport efficiency of optoelectronic detector 103. Charge sensing devices 219 and 221 sense the charges collected on readout nodes 203 and 205 in the form of current or voltage.

Figure 3:
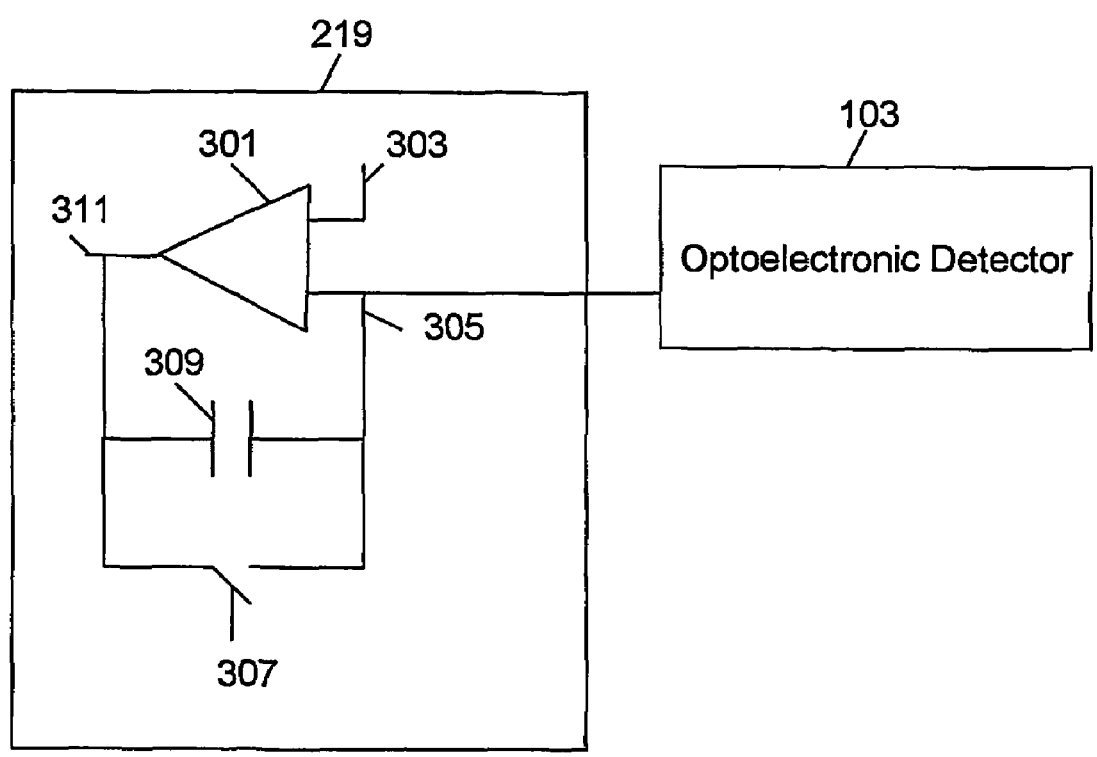
FIG. 3 illustrates an example circuit for readout circuits used in conjunction with the optoelectronic detector.

FIG. 3 illustrates an example circuit for sensing the charges stored at readout nodes used in conjunction with the optoelectronic detector. This is a standard circuit for reading free electrons in the form of voltage. The example circuit for charge sensing device 219 comprises an amplifier 301 with a positive input node 303, negative input node 305 and an output node 311. Negative input node 305 is connected to one of readout node 203 while positive input node 303 is set at a voltage, $V_{reset}$, the reset voltage that acts as a reference voltage. Negative input node 305 is also connected to output node 311 through a switch 307 and a feedback capacitor 309 with capacitance $C_f$. Switch 307 and capacitor 309 are connected in parallel between negative input point 305 and output point 311. To sense the charges from a readout node, capacitor 309 is initially discharged by closing switch 307. The charges stored on the connected readout node $Q_{read}$ are then stored on capacitor 309 by opening switch 307. Stored charges develop a potential difference across capacitor 309 given by the following equation:

$$\text{Voltage drop} = Q_{read}/C_f.$$

The voltage at output node 311, $V_{out}$ gives the voltage corresponding to the free electrons created by the light, wherein $V_{out}$ is defined as $V_{out}=V_{reset}+Q_{read}/C_f$.

Figure 4:
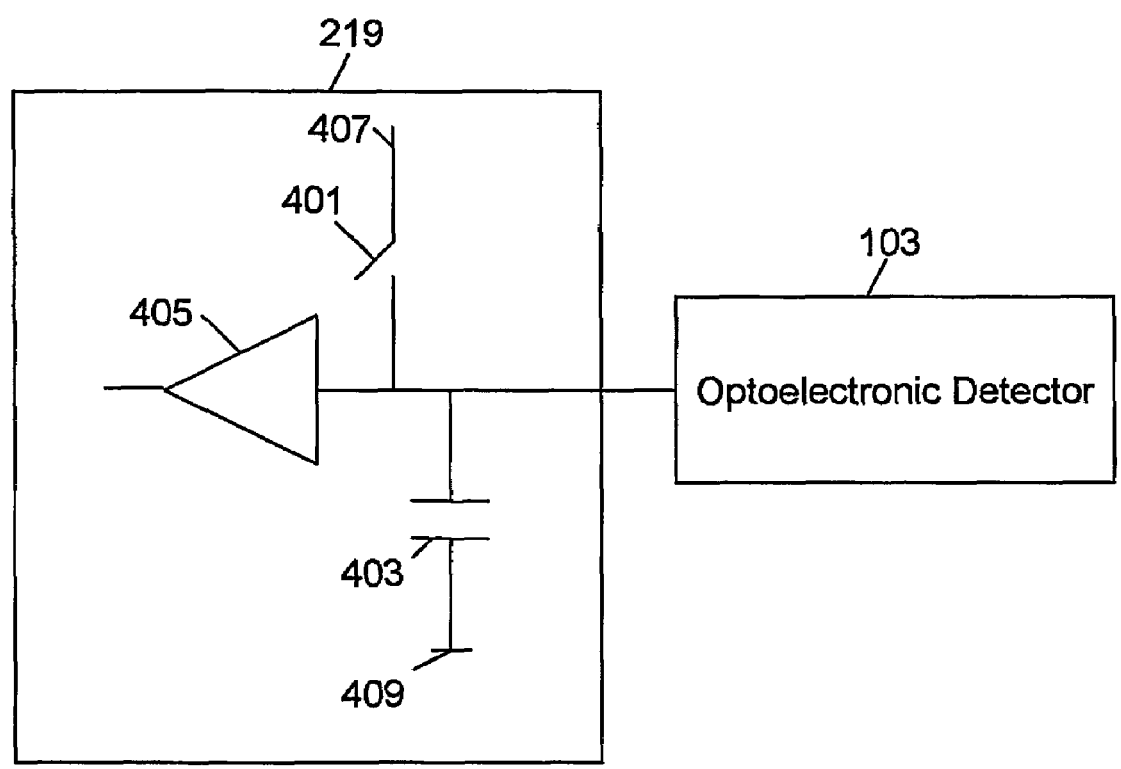
FIG. 4 illustrates an alternative example circuit for readout circuits used in conjunction with the optoelectronic detector.

FIG. 4 is an alternative example circuit for readout circuits used in conjunction with the optoelectronic detector used for sensing the collected free charges at readout nodes 203 and 205. The example circuit for charge sensing device 219 comprises a switch 401, a parasitic capacitor 403 with capacitance $C_{par}$, and a junction diode 405. A node 407 and a node 409 are set at reset voltage $V_{reset}$. Initially, the circuit is reset to set the readout node to voltage $V_{reset}$ by closing switch 401. After the reset, switch 401 is opened and the charges collected on the readout node are discharged into parasitic capacitor 403. This charge is then sensed in the form of a voltage difference on readout node 203 after a certain number of switching cycles.

The charge sensing circuits described using FIG. 3 and FIG. 4 can also drain a readout node of all the free charges collected at it without sensing it in the form of voltage. In case the circuit of FIG. 3 is used, closing reset switch 307 drains the readout node. However, if the circuit of FIG. 4 is used, then closing reset switch 401 and thereby connecting to the reset potential, $V_{reset}$, achieves draining of the readout node.

Optoelectronic detector 103 has various optoelectronic applications. In particular, optoelectronic detector 103 can act as a photomixing device to measure properties of the light such as intensity, phase shift and amplitude of the light.

Figure 5:
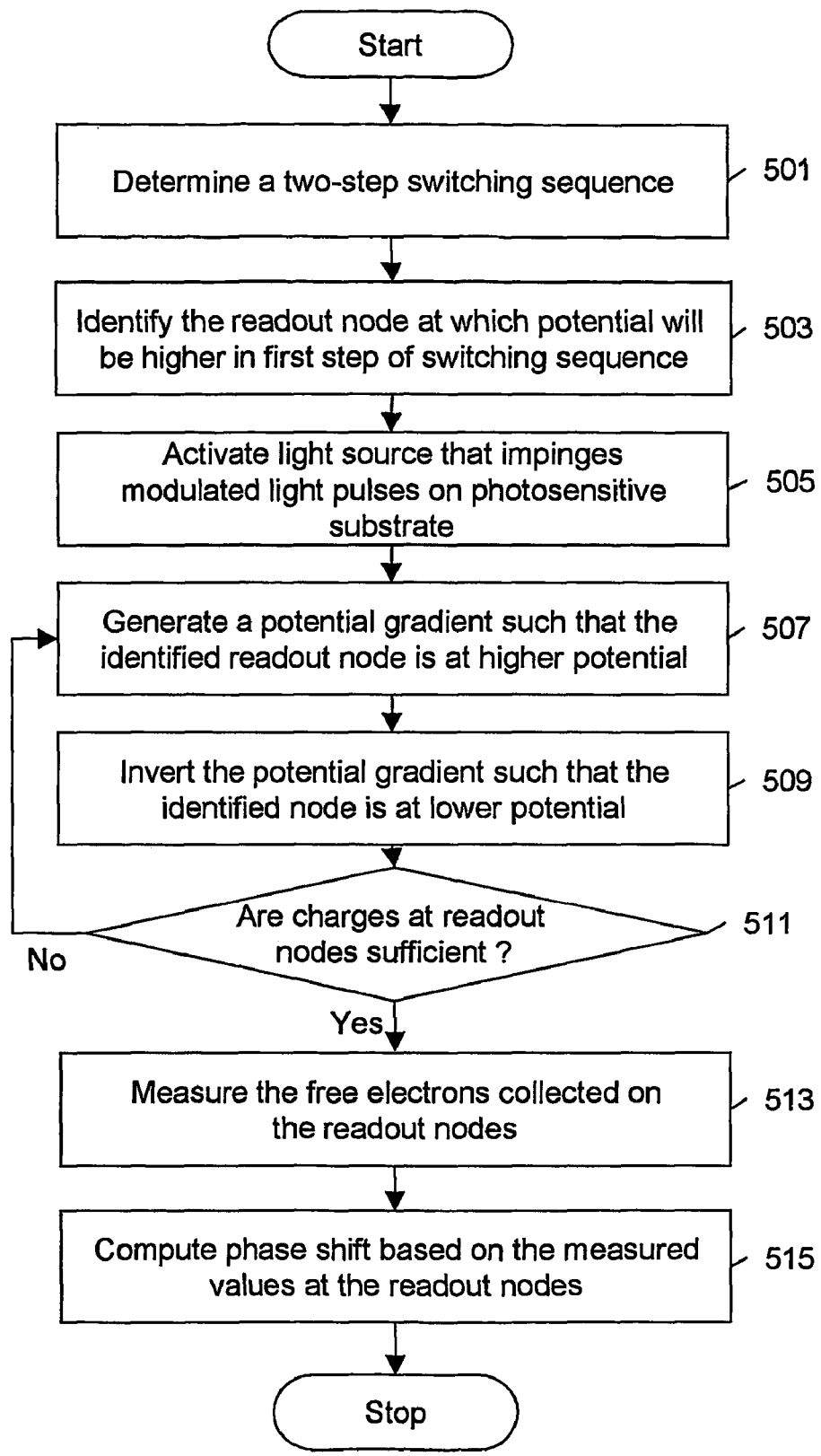
FIG. 5 is a flowchart illustrating the application of optoelectronic detector as a photomixing device.

FIG. 5 is a flowchart illustrating the application of optoelectronic detector as a photomixing device. In particular, optoelectronic detector 103 can measure the phase shift of the light. For example, consider optoelectronic detector 103 in FIG. 1, with two readout nodes wherein charge-sensing devices 219 and 221, respectively measure voltages V1 and V2 at the end of one switching sequence cycle. At step 501, a two step switching sequence is determined. Let the switching sequence be the same as illustrated already for a light with frequency 10 MHz earlier in the description. At step 503, the readout node at which the potential is higher in the first step of switching cycle, is determined. Suppose, a high voltage is applied to electrical contact site 215 and lower voltage is applied to electrical contact site 213 for the first 50 ns, i.e., the first step of switching cycle. In the next 50 ns, electrical contact site 213 is kept at a high voltage and electrical contact site 215 is kept at a lower voltage. This implies that at the first step of switching cycle readout node 205 will have a higher potential.

At step 505, light source 101 that impinges modulated light on photosensitive substrate 201, is activated. Impingement of light on photosensitive substrate 201 generates free electron-hole pairs. At step 507, potential gradient is generated between readout nodes 203 and 205 in accordance with the first step of the switching sequence. The free electrons generated during step 507 are steered to readout node 203. At step 509, potential gradient is generated between readout nodes 203 and 205, according to the second step of switching sequence. The free electrons generated during step 509 are steered to readout node 205. The switching sequence carried out by steps 507 and 509 can be repeated several times to collect sufficient amount of charges at the respective readout nodes 203 and 205. The sufficiency of the amount of charges is determined by the desired signal to noise ratio for a particular application of optoelectronic detector.

For example, suppose an application desires a signal to noise ratio value as 5:1. Let the pulse duration of one pulse be 50 ns. The switching sequence for the detector is set so that the integration time for read out node 1 is 25 ns and read out node 2 is 25 ns. Therefore, the period of the entire switching cycle is 50 ns. If the photon to electron conversion rate of an optoelectronic detector is 50%, then for two impinging photons one electron is detected. Thus, if one pulse of the illumination creates an average of two photons on the photosensitive substrate, then according to the conversion rate one electron is created in the photosensitive substrate in 50 ns. Due to the switching sequence, during the first 25 ns of a light pulse, 0.5 electron is created at readout node 1 and during the next 25 ns of the light pulse, 0.5 electron is created at readout node 2. Let the background illumination during the 50 ns of light pulse create 0.1 electron. In light of the switching sequence, background illumination creates 0.05 electrons for readout node 1 in the first 25 ns and 0.05 electrons for readout node 2 in the next 25 ns.

Suppose, the noise created due to conversion of electrons into voltage be 100 electrons. In light of the above given specifications, the number of times the switching sequence needs to be repeated for 2000 cycles to achieve a signal to noise ratio of 5:1.

At step 511, the sufficiency of the amount of charges or the number of cycles corresponding to the collection of sufficient amount of charges at the readout nodes is checked. If the number of cycles required is not complete, then step 507 and 509 are repeated, else at step 513, charge-sensing devices 219 and 221 read the free electrons collected at readout nodes 203 and 205. At step 515, voltages measured by charge sensing devices 219 and 221 are utilized to compute phase shift of the light according to the following equations:

$$\text{Phase shift} = (V1 - V2)/(V1 + V2) \qquad \text{Equation 1}$$

The measured voltages can also be used to compute the intensity of light as follows:

$$\text{Intensity} = V1 + V2 \qquad \text{Equation 2}$$

The optoelectronic detector as described in FIG. 2 can also suppress the background illumination associated with modulated light if one of the readout nodes is constantly drained and the other readout node used to collect free charges.

Figure 6:
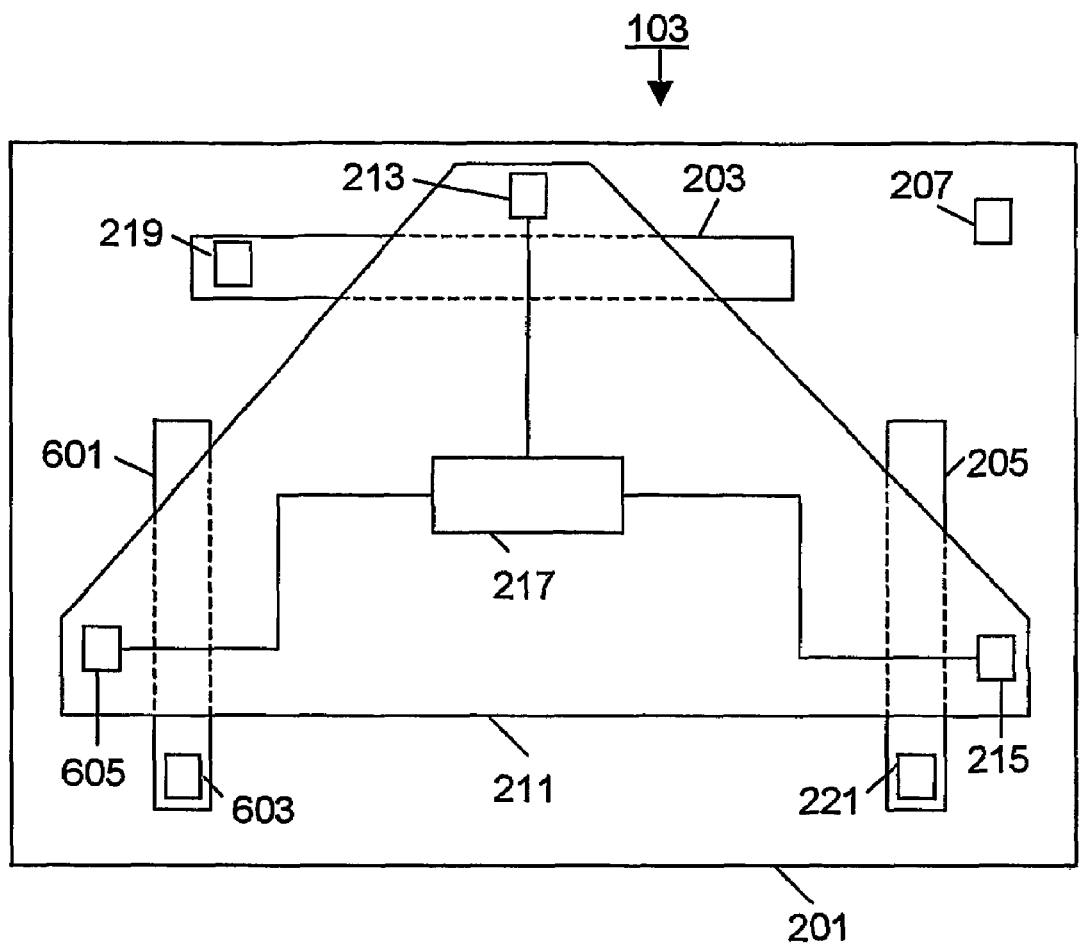
FIG. 6 illustrates a top-view of an optoelectronic detector with three readout nodes that suppresses background illumination.

FIG. 6 illustrates a top-view of an optoelectronic detector with three readout nodes, one of the applications of which is to suppress background illumination. Doped photosensitive substrate 201 forms the substrate of optoelectronic detector 103. Readout nodes 203, 205 and 601 are embedded in photosensitive substrate 201. Electrode 211 forms the top most layer of detector 103. Between electrode 211 and photosensitive substrate 201 lies a layer of dielectric material to prevent flow of electrons between the two layers. Charge sensing devices 603, 219 and 221 are connected to readout nodes 601, 203 and 205 respectively. Electrical contact sites 605, 213, 215 and 207 allow application of voltage to various regions within optoelectronic detector 103. Each electrical contact site corresponds to only one readout node, the number of electrical contact sites and readout nodes being the same. Switching unit 217 connects to electrical contact sites 605, 213 and 215. Switching unit 217 changes the voltages applied to electrical contact sites 605, 213 and 215 depending on a predefined switching sequence.

Figure 7:
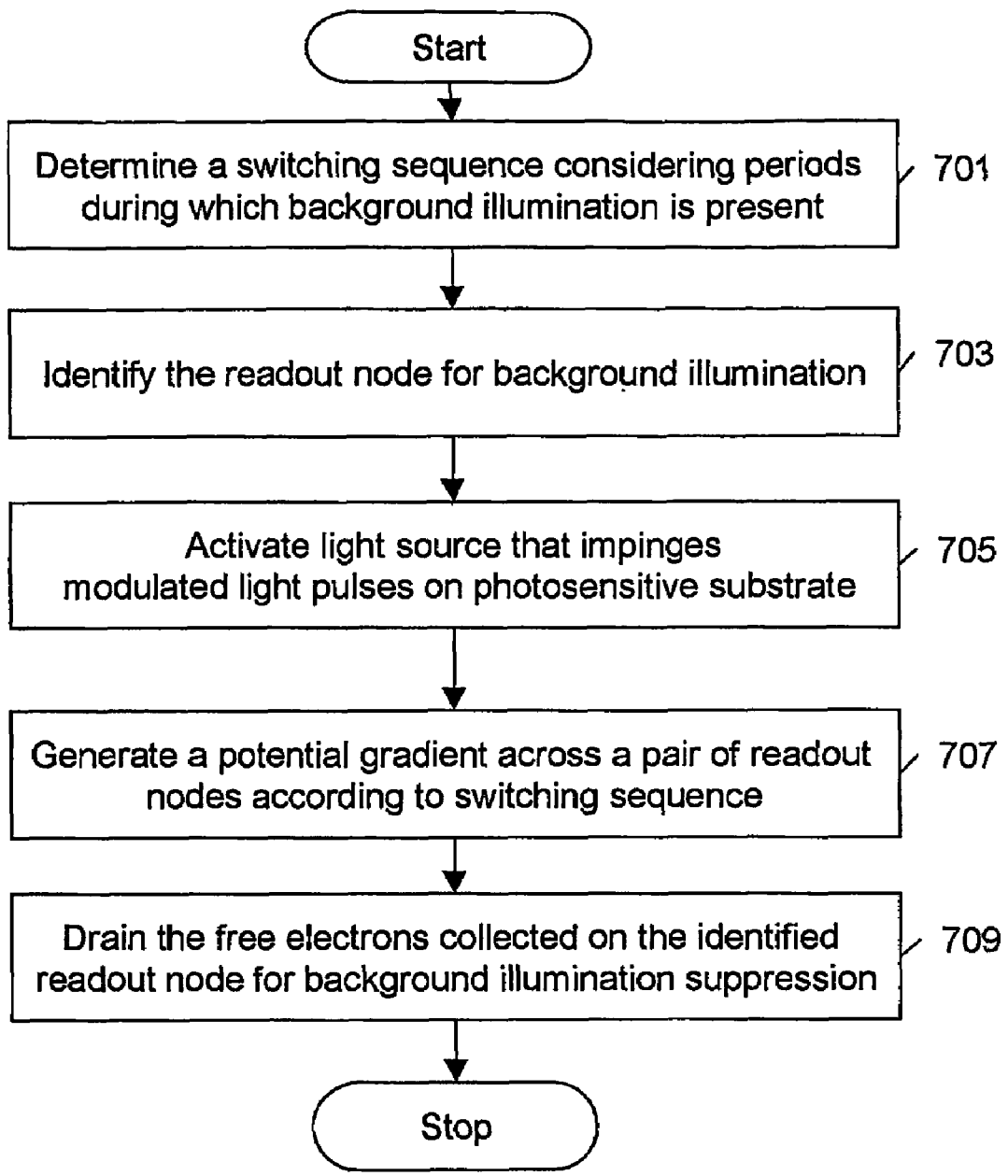
FIG. 7 is a flowchart illustrating the method for suppression of background illumination.

FIG. 7 is a flowchart illustrating the method for suppression of background illumination. The set up in FIG. 6 with three readout nodes 601, 203 and 205 can suppress background illumination in light. First step 701 is determination of switching sequence for the method. The switching sequence is decided keeping into consideration the periods in which light is present along with background illumination and another period in which only background illumination is present. At step 703, the readout node at which electrons corresponding to background illumination is identified. Suppose, the duration of light pulse generated by a source is 50 ns and the delay between two pulses is 1 µs. Switching unit 217 is set so that electrical contact site 213 is at a high voltage for the first 50 ns and electrical contact site 215 is at a high voltage for the next 50 ns. Finally, electrical contact site 605 is at a high voltage until a new light pulse is emitted by light source 101. Therefore, electrical contact sites 213 and 215 are at high voltages during the periods when light is present along with the background illumination. On the other hand, electrical contact site 605 is at a high voltage when only background illumination is present.

At step 705, light source 101 is activated to impinge light on photosensitive substrate 201. At step 707, the potential gradients at electrical contact sites 213, 215 and 605 are applied according to the switching sequence. Readout node 601, corresponding to electrical contact site 605, collects free electrons generated by background illumination when the potential at readout node 601 is highest according to the switching sequence. These free electrons collected at readout node 601 are constantly drained at step 709.

While one of the contact sites is at a high voltage, the other two contact sites are at ground voltage. The switching sequence as already described is repeated until sufficient electrons are collected at readout nodes 203 and 205.

After completion of sufficient number of switching cycles, charge sensing devices 219 and 221 sense charges collected at the respective readout nodes 203 and 205. The free electrons collected at readout node 601 are drained out by connecting charge sensing device 603 to reset potential. The period during which electrons collect at draining readout node 601 is longer than the period during which electrons collect at nodes 203 and 205. Longer period for draining achieves significant suppression of the background illumination. The drained out charges correspond to the portion of light that contribute to the background illumination. The electrons collected at readout nodes 203 and 205 are subsequently used to rebuild the light signal with significantly reduced background illumination.

Although the method, in FIG. 7, for reducing background illumination is illustrated using optoelectronic detector 103, the method can also be implemented using any optoelectronic device that has a photosensitive substrate, a plurality of readout nodes and a means for steering free electrons (e.g. an electrical contact site) to one of the readout nodes.

Although optoelectronic detectors with two and three readout nodes have been described above, it should be clear to anyone ordinarily skilled in the art that the optoelectronic detectors can have any number of nodes. In particular, the optoelectronic detectors with at least two readout nodes (not necessarily three readout nodes) can suppress background illumination by draining the charges collected over several switching cycles at one of the readout nodes. Further, photosensitive substrate 201 can be either p-type or n-type and correspondingly the readout nodes can be n-type or p-type respectively. In addition, dielectric 209 and electrode 211 need not be transparent. Further, optoelectronic detector 103 can detect light of any frequency.

The current invention has many advantages. First, the optoelectronic detector disclosed in the detailed description has high transport efficiency. Higher transport efficiency results from the continuous potential gradient across the depletion region. Therefore, the detector measures characteristics of light such as phase shift and intensity with greater accuracy.

Another advantage of the disclosed optoelectronic detector is that it can extend to any number of readout nodes by making changes to geometry of the detector. This extension to greater number of readout nodes further improves the accuracy of the optoelectronic detector. For example, multiple readout nodes can suppress background illumination when measuring phase shift and intensity of modulated light. Further, multiple readout nodes can more accurately measure higher frequency components of a light with greater accuracy or to extend the range over which phase shifts is measured.

Another advantage of the invention is that charges can accumulate over several cycles of switching sequence at the readout nodes. In particular, if the integration time is very low, charges are collected at readout nodes for several cycles before being measured by the charge sensing devices. This reduces the effect of charge to voltage conversion noise in the measurement of the properties of the light. Consequently, the optoelectronic detector measures the properties of light with very high frequency, i.e., very low integration times, with greater accuracy.

Yet another advantage of the invention is that switching between the different contact points for applying high voltage need not continue in either anti-clockwise or clockwise direction. The switching sequence can follow any direction between the electrical contact sites. Therefore, motion of the electrons can be steered in any direction, at any point in time.

While the preferred embodiments of the invention have been illustrated and described, it will be clear that the invention is not limited to these embodiments only. Numerous modifications, changes, variations, substitutions and equivalents will be apparent to those skilled in the art without departing from the spirit and scope of the invention as described in the claims.

The invention claimed is:

1. A method for suppression of background illumination in modulated light using an optoelectronic detector, the detector having a photosensitive substrate, a plurality of readout nodes and a plurality of means for steering free electrons to one of the readout nodes, the method comprising the steps of:
   a. determining a switching sequence, the switching sequence being synchronized with the modulation frequency of the light, the switching sequence comprising periods in which light is present along with background illumination and a period in which only background illumination is present;
   b. identifying a readout node corresponding to the period in which only background illumination is present;
   c. activating a light source, the activation leading to impingement of modulated light on the photosensitive substrate, the impingement resulting in generation of free electron-hole pairs in the photosensitive substrate;
   d. steering free electrons to one of the readout nodes according to the switching sequence, the free electrons being steered to the identified readout node during the period in which only background illumination is present; and
   e. draining free electrons collected at the identified readout node.

2. The method according to claim 1 wherein the step of determining a switching sequence comprises the steps of:
   a. determining modulation frequency of the modulated light; and
   b. determining a time period using the determined modulation frequency.

3. The method according to claim 1 wherein the step of identifying the readout node corresponding to the period in which only background illumination is present comprises the steps of:
   a. determining the time period during which light is absent; and
   b. determining the readout node to which electrons are steered during the determined time period.

4. The method according to claim 1 wherein the step of steering free electrons to a readout node comprises generating potential gradient across a pair of readout nodes.

5. The method according to claim 4 wherein the step of generating potential gradient comprises the step of applying voltage gradient across the corresponding means for steering free electrons.

6. The method according to claim 1 wherein the step of draining free electrons at a readout node comprises the step of connecting the readout node to a source of reset potential.

* * * * *